United States Patent [19]

Chakradhar

[11] Patent Number: 5,663,888
[45] Date of Patent: *Sep. 2, 1997

[54] REDESIGN OF SEQUENTIAL CIRCUITS TO REDUCE CLOCK PERIOD

[75] Inventor: Srimat T. Chakradhar, No. Brunswick, N.J.

[73] Assignee: NEC USA, Inc., Princeton, N.J.

[*] Notice: The term of this patent shall not extend beyond the expiration date of Pat. No. 5,555,188.

[21] Appl. No.: 641,083

[22] Filed: Apr. 29, 1996

Related U.S. Application Data

[63] Continuation of Ser. No. 38,472, Mar. 30, 1993, abandoned.

[51] Int. Cl.$^6$ ........................................ G06F 17/50
[52] U.S. Cl. .................... 364/489; 364/488; 364/491
[58] Field of Search ........................... 364/488, 489, 364/490, 578; 395/500

[56] References Cited

U.S. PATENT DOCUMENTS

| | | | |
|---|---|---|---|
| 4,827,428 | 5/1989 | Dunlop et al. | 364/491 |
| 4,890,238 | 12/1989 | Klein et al. | 364/491 |
| 4,924,430 | 5/1990 | Zasio et al. | 364/578 |
| 5,077,676 | 12/1991 | Johnson et al. | 364/489 |
| 5,095,454 | 3/1992 | Huang | 364/578 |
| 5,218,551 | 6/1993 | Agrawal et al. | 364/491 |
| 5,237,514 | 8/1993 | Curtin | 364/490 |
| 5,251,147 | 10/1993 | Finnerty | 364/489 |
| 5,282,148 | 1/1994 | Poirot et al. | 364/489 |
| 5,392,221 | 2/1995 | Donath et al. | 364/489 |
| 5,397,749 | 3/1995 | Igarashi | 437/250 |
| 5,448,497 | 9/1995 | Ashar et al. | 364/489 |
| 5,553,000 | 9/1996 | Dey et al. | 364/488 |
| 5,555,188 | 9/1996 | Chakradhar | 364/490 |

OTHER PUBLICATIONS

Hitchcock, Sr. et al., "Timing Analysis of Computer Hardware," IEEE, J. Res. Dev., Jan. 1982.

McFarland et al., "The High Level Synthesis of Digital Design Systems", IEEE, Feb. 1990.

Dey et al., "Partitioning Sequential Circuits for Logic Optimization", IEEE, 1991, pp. 70–76.

A. Hung and T.Y. Meng, "Asynchronous Self–timed Circuit Synthesis with Timing Constraints", pp. 1126–1130, 1990, IEEE.

Singh et al., "Timing Optimization of Combinational Circuit," IEEE, pp. 282–285.

*Primary Examiner*—Kevin J. Teska
*Assistant Examiner*—Thai Phan
*Attorney, Agent, or Firm*—Jeffery J. Brosemer; Arthur J. Torsiglieri

[57] ABSTRACT

A process for redesign of a sequential circuit to provide a functionally equivalent circuit that can operate with a shorter clock cycle. It includes forming a path graph of the circuit, classifying short and long arcs of the graph and developing sets of short and long path inequalities from which there is developed an objective function which is solved to provide an optimal set of delay constraints. These are used to synthesize a new circuit which after retiming results in the desired redesigned circuit.

6 Claims, 2 Drawing Sheets

5,663,888

REDESIGN OF SEQUENTIAL CIRCUITS TO REDUCE CLOCK PERIOD

This is a continuation of application Ser. No. 08/038,472 filed Mar. 30, 1993 entitled "Redesign of Sequential Circuits to Reduce Clock Period," which is now abandoned.

FIELD OF INVENTION

This invention relates to the computer-aided-design (CAD) of integrated circuits and, more particularly, to the redesign of sequential integrated circuits to reduce the clock period at which the circuit operates.

BACKGROUND OF THE INVENTION

Logic synthesis using computers has become the standard technique for the design of large scale sequential integrated circuits, which are circuits that include combinational subcircuits separated by storage or memory elements, such as clocked flip-flops and registers, also known as latches.

It is often the case that sequential circuits, as initially synthesized by CAD tools, include combinational subcircuits that with redesign can be operated with shorter clock periods, a factor that is normally desirable. There have been various ongoing efforts to devise techniques for the redesign of sequential integrated circuits to reduce the clock period at which they can operate and retiming has been an important one of these techniques. Retiming generally revolves repositioning of the flip-flops in the circuit, typically to reduce the length of the longest combinational subcircuits at the expense of adding to the length of shorter combinational subcircuits. In some cases, resynthesis of the combinational subcircuits can also result in a faster integrated circuit. A combination of retiming and synthesis usually results in shorter clock periods that may not be achievable using only one of these techniques.

SUMMARY OF THE INVENTION

In one aspect, the invention represents a particular solution to this basic problem of synthesizing high-performance integrated circuits using a combination of retiming and resynthesis.

In another aspect, the invention relates to a novel technique for retiming that can be used not only in the particular solution but for retiming general integrated circuits.

The present invention involves the computer-implemented derivation of an optimal set of delay constraints and the use of such set to resynthesize the sequential circuit without affecting its functional characteristics. To derive the optimal set, the sequential circuit is treated as an interconnection of path segments with pre-specified delays, where path segments are segments bounded by flip-flops, primary input or primary outputs. In particular, the path segments are used first to form a path graph of the circuit and thereafter to classify each arc of the graph either as long, if its weight exceeds the desired reduced clock period or short if its weight is less than or equal to the desired clock period. Then there is formulated a set of inequalities for short and long arcs, with one inequality for each short arc and three inequalities for every long arc. An objective function that increases the tolerable delay on all path segments, and particularly biased towards long path segments, is then constructed. A known minimum cost flow algorithm is used on this function to derive the optimal set of delay constraints. The circuit is then resynthesized using known combinational resynthesis technique to satisfy this optimal set of delay constraints. This resynthesized circuit is then retimed to achieve the desired reduced clock period. Advantageously, in a preferred embodiment, the invention employs the novel retiming technique that is a distinct feature of the invention.

DETAILED DESCRIPTION OF THE DRAWINGS

Figure 1:
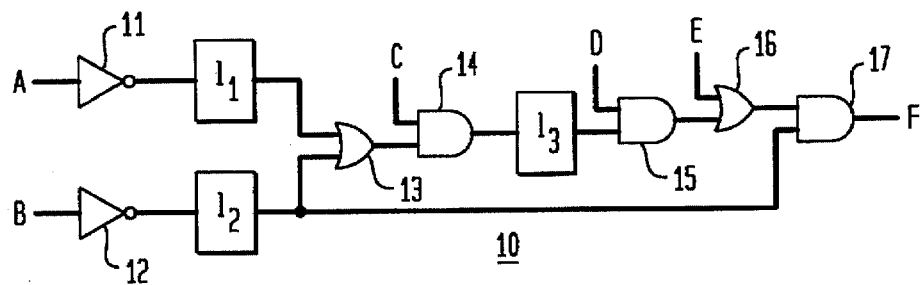
FIG. 1 is a schematic block diagram of a sequential circuit that is to be redesigned to reduce its clock period to two delay units in accordance with the invention.

It will be helpful first to discuss some assumptions that are to be made in the course of practicing of the invention. If the desired clock period $\phi-\epsilon$ (where $\phi$ is the instant clock period and $\epsilon$ is the amount of decrease sought) cannot be achieved by retiming, then a combinational delay optimizer can be used to resynthesize the combinational logic of the sequential circuit.

Consider a sequential circuit S. Let $L=\{l_1 \ldots l_k\}$ be the set of flip-flops, the primary inputs and primary outputs of S. The primary inputs or latch outputs of S are the primary inputs of its combinational logic. Also, the primary outputs or latch inputs of S are the primary outputs of its combinational logic. In what follows, we will refer to the primary inputs and primary outputs of the combinational logic simply as inputs and outputs, respectively. A combinational delay optmizer can be used to resynthesize the combinational logic. The delay optimizer attempts to satisfy pre-specified maximum tolerable path delays between inputs and outputs of the combinational logic. We refer to the maximum tolerable path delay between a given input and output of the combinational logic as a delay constraint. Different input and output pairs can have different delay constraints. These delay constraints are usually specified as the arrival and required times of the primary inputs and primary outputs, respectively, of the combinational logic. We use the following notation to represent the arrival and required times of inputs and outputs, respectively, of the combinational logic. If $l_i$ is a latch, its output is an input to the combinational logic. We denote the arrival time of the latch output by $x^a_i$. Similarly, an input to latch $l_i$ is also an output of the combinational logic and the required time of the latch input signal is denoted by $x^r_i$. If $l_i$ is a primary input of S, it is also an input of the combinational logic. The arrival time of this input is also denoted by $x^a_i$. Note that in this case, $x^r_i$ is not defined. Similarly, if $l_i$ is a primary output of S, then it is also an output of the combinational logic. The required time of this output is also denoted by $x^r_i$. Note that in this case, $x^a_i$ is not defined. In the absence of external interface constraints, we assume that the arrival time for all primary inputs is 0 and the required time for all primary outputs is the desired clock period. If external timing constraints are specified, they can be easily incorporated into our delay computation framework.

A simple and natural specification of delay constraints is to assign an arrival time of 0 to all inputs and a required time of $\phi-\epsilon$ to all outputs of the combinational logic. Clearly, if the delay optimizer can resynthesize the logic to satisfy this set of delay constraints, then the resynthesized logic can operate with a clock period of $\phi-\epsilon$. However, in many cases it may be impossible to resynthesize the circuit to meet this delay constraint.

A recent proposal for performance optimization of sequential circuits uses the input slack of latches to obtain a simple set of delay constraints. This proposal is described in copending application Ser. No. 07/972,149, filed Nov. 5, 1992 and assigned to the same assignee as the instant application. In this proposal, if latch $l_i$ has an input slack $s_i$, then the latch output signal is assigned an arrival time of $x^a_i = -s_i$. This is possible since the latch can be moved forward by $s_i$ without making any paths terminating at $l_i$ become critical. However, moving the latch forward by $s_i$ implies that the latch input signal must arrive $s_i$ units of time earlier than the default required time of $\phi-\epsilon$ for all outputs of the combinational logic. Therefore, the new required time for the latch input signal is $x^r_i = \phi-\epsilon-s_i$. The delay optimizer resynthesizes the combinational logic under these delay constraints. However, there are cases when the delay optimizer will fail to meet the delay specifications. Again, there may not exist a combinational logic implementation that satisfies the delay requirements.

For example, consider the circuit in FIG. 1. As seen, this circuit 10 includes a pair of inverters 11 and 12 having input terminals a and b, respectively, that supply separate inputs to OR gate 13, by way of latches $l_1$ and $l_2$. The output of OR gate 13 supplies an input to AND gate 14, the other input of which is supplied by a primary input c. The output of AND gate 14 supplies by way of latch $l_3$ one input to AND gate 15, the other input of which is supplied by primary input terminal d. The output of AND 15 supplies one input to OR gate 16, the other input of which is supplied by input terminal d. The output of OR gate 16 supplies one input to AND gate 17, the other input of which is supplied by the output of latch $l_2$. The output of AND gate 17 supplies the output terminal f. If it is assumed that each gate provides unit delay, the clock period required for the circuit is $\phi=3$ and this cannot be reduced any further by retiming. This is the case because there is a combinational path between primary input d and the primary output f that has a delay of 3. Also, combinational delay optimization cannot reduce the delay of the circuit any further. If the desired clock period is 2, latches $l_1$ and $l_2$ have an input slack of 1. However, latch $l_3$ has no input slack. Therefore, $x^a_1 = x^a_2 = -1$ and $x^a_3 = 0$. The arrival time of all primary inputs is 0 and the required time of the primary output f is 2. The required times of the latch input signals of $l_1$, $l_2$ and $l_3$ are $x^r_1 = x^r_2 1, x^r_3 = 2$. It is impossible to resynthesize the combinational logic to meet these delay constraints since there does not exist an implementation for f that meets the delay constraints. However, the present invention makes it possible to compute an easier set of delay constraints that can be satisfied by the delay optimizer. A clock period of 2 can be achieved by combinational resynthesis and subsequent retiming, as will appear hereinafter.

The above example reveals limitations of computing delay constraints based on local information like the input slack of latches. Also, the delay optimizer can satisfy certain delay constraints more easily than others and it is important to define a measure of difficulty for the delay optimizer. We propose a measure of difficulty for the delay optimizer and then compute a set of optimal delay constraints for the delay optimizer. Our measure is based on explicit path delays to be satisfied by the delay optimizer. Also, our measure induces a partial order on the set of possible delay constraints. The delay constraint set is optimal in the sense that it is the easiest constraint that can be specified to the delay optimizer.

The optimal delay constraint set is computed by viewing the sequential circuit shown in FIG. 1 as an interconnection of path segments with pre-specified delays. Path segments are segments bounded by flip-flops, primary inputs or primary outputs. We simultaneously consider delays on all path segments and formulate the delay constraint calculation problem as a minimum cost network flow problem. The optimal solution to the flow problem corresponds to an optimal delay constraint set. If the delay optimizer satisfies this delay constraint set, then the resynthesized circuit may have several paths exceeding the desired clock period. However, the resynthesized circuit can be retimed to achieve the desired clock period.

We note that if a delay optimizer can resynthesize combinational logic to satisfy the delay constraints proposed in the aforementioned copending application then the delay optimizer can also satisfy our optimal delay constraint set. However, as we show later in the converse is not true. Delay optimizers can resynthesize logic to satisfy the optimal delay constraint set but it may be impossible to satisfy the delay constraints specified in said copending application.

A combinational delay optimizer can satisfy certain delay constraints more easily than others. For example, a delay constraint set that requires all path delays to be less than $\phi-\epsilon$ is more stringent than a delay constraint set that requires most paths to have a delay less than or equal to $\phi-\epsilon$ but allows some paths to have a delay more than $\phi-\epsilon$. This is because the delay optimizer may be able to resynthesize the logic to satisfy the latter constraint set but it may fail to satisfy the former constraint set. Also, if the delay optimizer satisfies the former constraint set, it automatically satisfies the latter constraint set.

For the practice of the invention we propose the following measure of difficulty for combinational delay optimization. Given only structural descriptions of circuits, we use path lengths in the combinational logic to obtain a measure of difficulty. If functional information about the circuit or its internal signals is available, it is possible to incorporate this information into our measure. Let $D_1$ and $D_2$ be two delay constraint sets on paths in the combinational logic. Let p be any path in the combinational logic. If the maximum allowable path delay on any path p in constraint set $D_1$ is always greater than or equal to the corresponding allowable path delay on p in set $D_2$, then we define $D_1 \leq D_2$. Note that our definition induces a partial order on the delay constraints on paths in the combinational logic. Constraint $D_1$ is less stringent than $D_2$ because the delay optimizer may be able to satisfy $D_1$ but it may fail to satisfy $D_2$. Also, $D_1$ is automatically satisfied whenever $D_2$ is satisfied. Let $D_2$ be the set of actual maximum path delays between any input and output pair of the combinational logic. If the combinational logic has m inputs and n outputs, then $D_2$ can have at most m×n elements. Since the clock period of S is more than the desired clock period $\phi-\epsilon$, the delay on some paths in the combinational logic exceeds $\phi-\epsilon$. Paths with delays exceeding the desired clock period are called long paths and paths with delays less than or equal to the desired clock period are called short paths.

We simultaneously consider delays on all path segments to obtain a delay constraint $D_1$ that satisfies the following two conditions:

1. $D_1 \leq D_2$
2. $D_1$ is the greatest lower bound for $D_2$. Therefore, there is no delay constraint $D_3$ so that $D_3 \leq D_2 \leq D_2$.

In a sense, the constraint $D_1$ is the easiest constraint that can be specified to the delay optimizer. Note that if the resynthesized logic meets the delay constraint $D_1$, there may be path segments with delays exceeding the desired clock period. However, as we show later, it is always possible to retime a resynthesized circuit in this way to achieve the desired clock period $\phi - \epsilon$.

The arrival and required times of the inputs and outputs, respectively, of the combinational logic are computed by simultaneously considering all path segments of the sequential circuit. Let the default arrival time of all inputs of the combinational logic be 0. Also, let $\phi - \epsilon$ be the default required time of all outputs of the combinational logic. Note that the primary inputs and outputs of the sequential circuit S assume the default values in any optimal delay constraint set. We specify the arrival times of all inputs of the combinational logic with respect to the primary inputs of S. Similarly, we specify the required times of all outputs of the combinational logic with respect to the required time of the primary outputs of S. The arrival time of the output signal of a latch and the required time of the latch input signal are related as follows. Consider a latch $l_i$. If the arrival time of the latch output signal is advanced by $x^a_i$ (i.e., this signal arrives $x^a_i$ units of time ahead of the primary inputs of S), then the latch input signal's required time is also advanced by the same amount. Therefore, the input signal of the latch is required to be ready $x^a_i$ units of time ahead of the primary outputs of S. Let $x_i$ be the number of time units by which the output signal of latch $l_i$ is advanced as compared to the primary inputs of S. If $x_i$ is negative, then the output signal of latch $l_i$ arrives $-x_i$ units of time after the primary inputs of S. Also, let $x_0$ denote the change in the arrival and required times of primary inputs and primary outputs of S.

We formulate the optimization problem by separately considering short and long path segments of S.

Short Paths:

Let p be the maximum delay from latch $l_i$ to $l_j$. Since we are considering a short path segment, $p \leq \phi - \epsilon$. If we assume that the output signal of latch $l_i$ arrives at the same time as the primary inputs of S, then the input signal of latch $l_j$ is ready before the default required time of $\phi - \epsilon$. Let the input signal of latch $l_j$ arrive $x_j$ units of time before its default required time. This implies that the output signal of latch $l_j$ is ready $x_j$ units of time before the primary inputs of S. Therefore, an additional delay of $x_j$ units of time can be tolerated on all path segments originating from latch $l_j$. The delay optimizer can resynthesize path segments originating from latch $l_j$ so that their delay does not exceed $\phi - \epsilon + x_j$ rather than the default value of $\phi - \epsilon$. Assuming that the delay optimizer is able to resynthesize these path segments to meet the delay constraint of $\phi - \epsilon + x_j$, some of the resynthesized path segments may have a delay exceeding the desired clock period of $\phi - \epsilon$. However, the delay on these resynthesized path segments can be reduced by moving latch $l_j$ forward by at most $x_j$ units of time during the retiming phase.

A similar argument applies to path segments terminating at latch $l_i$. If we assume that the input signal of latch $l_j$ arrives at the same time as the primary outputs of S, then the output signal of latch $l_i$ can arrive after the primary input signals have arrived. This is because the path segment between $l_i$ and $l_j$ is short. Let $\forall x_i$ be the number of time units the output signal of latch $l_i$ can arrive after the primary input signals of S have arrived. This implies that the input signal of latch $l_i$ can be ready $x_i$ units of time after the primary outputs of S. Therefore, an additional delay of $x_i$ units of time can be tolerated on all path segments terminating at latch $l_i$. The delay optimizer can resynthesize path segments terminating at latch $l_i$ so that their delay does not exceed $\phi - \epsilon + x_i$ rather than the default value of $\phi - \epsilon$. Again, assuming that the delay optimizer is able to resynthesize these path segments to meet the delay constraint of $\phi - \epsilon + x_j$, some of the resynthesized path segments may have a delay exceeding the desired clock period of $\phi - \epsilon$. However, the delay on these resynthesized path segments can be reduced by moving latch $l_i$ backward by at most $x_i$ units of time during the retiming phase.

We now analyze the more general case where the arrival times of output signals of both latches are advanced. Let $x_i$ and $x_j$ be the amounts by which output signals of latches $l_i$ and $l_j$, respectively, are advanced. If latch output signals are assigned their default arrival times, then the delay optimizer must resynthesize the path segment between $l_i$ and $l_j$ so that the delay does not exceed $\phi - \epsilon$. If we advance only the output signal of latch $l_i$, then a delay of $\phi - \epsilon + x_i$ can be tolerated between latches $l_i$ and $l_j$. However, if we advance only the output signal of latch $l_j$, then a delay of only $\phi - \epsilon - x_j$ can be tolerated between the two latches. Note that if $\phi - \epsilon - x_j \geq p$, then the delay optimizer does not have to resynthesize the path segment between the latches since the delay constraint is already satisfied by the current implementation. If output signals of both latches are advanced, then the delay optimizer must resynthesize the path segment between the two latches so that the delay does not exceed $\phi - \epsilon - \Delta p$. Here, $\Delta p = x_j - x_i$ is the net decrease in the tolerable delay between the two latches as compared to the default tolerable delay of $\phi - \epsilon$. If $\phi - \epsilon - \Delta p$ becomes less than the original delay of p, then it may be impossible to resynthesize the logic to achieve this delay bound. Therefore, we require that $\phi - \epsilon - \Delta p \geq p$.

Long Paths:

Let p be the maximum delay from latch $l_i$ to $l_j$. Clearly, $p > \phi - \epsilon$. If output signals of the two latches are assigned their default arrival times, then the delay optimizer must resynthesize the path segment between $l_i$ and $l_j$ to reduce the delay from p to $\phi - \epsilon$. If we advance only the output signal of latch $l_i$, then a delay of $\phi - \epsilon + x_i$ can be tolerated between latches $l_i$ and $l_j$ and the delay optimizer will be required to reduce the delay of this path segment from p to $\phi - \epsilon + x_i$ rather than $\phi - \epsilon$. Assuming that the delay optimizer is able to resynthesize these path segments to meet the delay constraint of $\phi - \epsilon + x_i$, some of the resynthesized path segments may have a delay exceeding the desired clock period of $\phi - \epsilon$. However, the delay on these resynthesized path segments can be reduced by moving latch $l_i$ forward by at most $x_i$ units of time during the retiming phase.

If we advance only the output signal of latch $l_j$, then only a delay of $\phi - \epsilon - x_j$ can be tolerated between the two latches. The delay optimizer will have to reduce the delay of this path segment from p to $\phi - \epsilon - x_j$ which may be more difficult to achieve than the original goal of $\phi - \epsilon$. If output signals of both latches are advanced, then the delay optimizer must resynthesize the path segment between the two latches to reduce the delay from p to $\phi - \epsilon - \Delta p$. Clearly, we require that $\Delta p \leq 0$. Otherwise, the delay optimizer will have to reduce the delay from p to a quantity that is lower than $\phi - \epsilon$ and this may be impossible to achieve.

The smaller the value of $\Delta p$, the less stringent is the delay constraint for the delay optimizer. However, $\Delta p$ need not decrease beyond $\phi - \epsilon - p$. This is because at this value of $\Delta p$, the tolerable delay on the path segment is equal to p and this delay constraint is already satisfied by the current implementation. Therefore, the delay optimizer does not have to resynthesize the path segment. The fact that $\Delta p$ need not decrease beyond $\phi-\epsilon-p$ can be captured in an optimization framework as follows:

Minimize $\epsilon_{ij}$
subject to
$\Delta p - \epsilon_{ij} \leq \phi - \epsilon - p$
$\epsilon_{ij} \geq 0$ Here, $\epsilon_{ij}$ is the amount by which the delay optimizer will have to reduce the path delay on the path from j to j. It will be convenient to describe this as the reduction factor.

We construct an objective function that is heavily biased towards increasing the tolerable delay on long path segments so that the tolerable delay is equal to the delay in the current implementation. This amounts to minimizing $\Sigma \epsilon_{ij}$ for all long path segments. A secondary goal is to increase the tolerable delays on all path segments.

Let P be the set of all path segments. Also, let $P_1$ and $P_2$ be the set of short and long path segments, respectively. We denote the path segment from $l_i$ to $l_j$ as $l_i \rightarrow l_j$. Let $d_{ij}$ be the delay of this segment. The optimization problem to obtain the optimal delay constraint can be stated as follows:

Maximize (1)
$$-\alpha \sum_{l_i \rightarrow l_j \in P_2} \epsilon_{ij} + \beta \sum_{l_i \rightarrow l_j \in P} x_i - x_j$$

subject to $l_i \rightarrow l_j \in P_1$:
$$x_j - x_i \leq \phi - \epsilon - d_{ij}$$

$l_i \rightarrow l_j \in P_2$:
$$x_j - x_i \leq 0$$
$$x_j - x_i - \epsilon_{ij} \leq \phi - \epsilon - d_{ij}$$
$$\epsilon_{ij} \geq 0$$

Here, $\alpha$ is significantly larger than $\beta$, where $\alpha$ and $\beta$ are parameters of relative importance, the optimization is performed under the following constraints:

Tolerable delay on short path segments is decreased by at most the amount they fell short of the desired clock period.

Tolerable delay on long paths is greater than or equal to the desired clock period.

A solution of the optimization problem may have $x_0 \geq 0$. Therefore, the arrival time for the output signal of latch $l_i$ is given by $x_i - x_0$.

The above optimization problem is the dual of the minimum cost flow problem. We will refer to the above optimization problem as the dual problem and the minimum flow cost problem as the primal problem. The network for the flow problem consists of a vertex for each variable $x_i$ in the dual. If the dual has a constraint $x_j - x_i \leq c$, then the network has an arc from j to i. Furthermore, the cost of unit flow over this arc is equal to c and this arc can carry an arbitrarily large amount of non-negative flow. If the dual has a constraint $x_j - x_i - \epsilon_{ij} \leq c$, then the network has an arc from j to i. The cost of unit flow over this arc is equal to c and the flow on this arc cannot exceed $\alpha$. The coefficient of $x_i$ in the dual objective function is the net flow out of vertex i in the flow network. If the net flow is positive (negative), then vertex i is a source (sink). If the net flow is 0, then vertex i is a transhipment node of the network and the total flow is conserved.

A useful variation of the above problem is as follows. Among long paths, we may prefer to decrease certain longer paths more than others. Our preference may be dictated by functional information available about the long paths. This can be easily incorporated into the objective function as follows. If the maximum path delay between $l_i$ and $l_j$ is p ($p \geq \phi - \epsilon$), then we include the term $p \times (-\Delta p)$ in the objective function. Another variation would be to require that the arrival times (required times) of any latch output (input) signal be ahead of the primary inputs (outputs). All these variations translate into additional constraints that can be easily added to the basic optimization framework. Many other variations are possible using the above optimization framework.

A systematic procedure to obtain the optimal set of delay constraints is as follows:

1. Construct the path graph for circuit S. A path graph P has a vertex $l_i$ for every latch $l_i$. Primary inputs and primary outputs of circuit S are represented by a single vertex $l_0$. If there is some path from latch $l_i$ to $l_j$ in circuit S, graph P has an arc from vertex $l_i$ to vertex $l_j$ with a weight equal to the maximum path delay from latch $l_i$ to latch $l_j$. If $l_i$ is a primary input, then there is an arc from $l_0$ to $l_j$. Similarly, if $l_j$ is a primary output, then there is an arc from $l_i$ to $l_0$. Combinational paths between primary inputs and primary outputs are not included in the path graph since the delays on these paths can only be reduced by combinational resynthesis.

2. Classify arcs into short and long arcs. An arc is long (short) if its weight exceeds (is less than) the desired clock period.

3. Formulate inequalities for short and long arcs. There is one inequality for every short arc and three inequalities for every long arc.

4. Construct objective function.

5. Solve optimization problem using minimum-cost flow algorithm.

Suitable algorithms are found in a book entitled "Combinatorial Optimization: Algorithms and Complexity" by C. H. Papadimitriou and K. Steiglitz, Prentice Hall Inc., Englewood Cliffs, N.J. Let $X_i$, $0 \leq i \leq k$ be the optimal arrival time of the output signal of latch $l_i$. If $X_0$ is non-zero, then we adjust the arrival time for the latch output signal is given by $X_i - X_0$. This translation is done since there is no change in the arrival times of the primary inputs. In the sequel, we assume that this adjustment (if necessary) has been performed and that $X_i$ refers to the adjusted arrival time for the latch output signal.

The optimal arrival and required times for the combinational delay optimizer are obtained follows:

1. Primary inputs are assigned an arrival time of 0. Also, the output of latch $l_i$ is assigned an arrival time of $-X_i$.

2. Primary outputs are assigned a required time equal to the desired clock period $\phi - \epsilon$. All other latch inputs are assigned a required time of $\phi - \epsilon - X_i$.

We illustrate the delay constraint set calculation by an example. Consider the circuit shown in FIG. 1, described earlier. As earlier discussed, the clock period of the circuit is $\phi = 3$ and this cannot be reduced any further by retiming. This is because there is a combinational path between primary input d and the primary output f that has a delay of 3. Also, combinational delay optimization cannot reduce the delay of the circuit any further. This is because the primary output function f cannot be resynthesized to achieve a clock period of 2. We will show that combinational resynthesis using the optimal delay constraint set can reduce the clock period to 2. Therefor, the reduction in clock period is $\epsilon = 1$.

Figure 2:
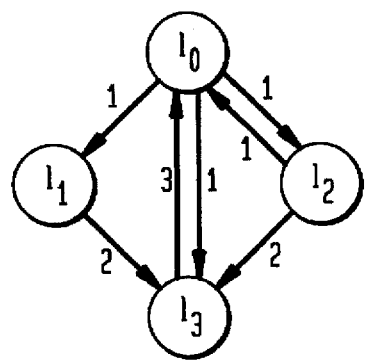
FIG. 2 is the path segment graph of the circuit of FIG. 1.

The path graph for the circuit in FIG. 1 is shown in FIG. 2. It has three vertices $l_1$, $l_2$ and $l_3$ corresponding to the three latches in the circuit. Vertex $l_0$ as discussed in step one of the procedure outlined above, corresponds to the primary inputs and primary outputs of the circuit, since there is a path from primary inputs to latch $l_1$ with a maximum delay of 1, we include the arc $l_0 \rightarrow l_1$ with a weight of 1 in the path graph. Similarly, paths from latch $l_3$ to primary outputs are represented by the arc $l_3 \rightarrow l_0$. The weight of this arc is 3 since the maximum delay on any path from $l_3$ to a primary output is 3. Other arcs in the path graph can be constructed similarly.

Arc $l_0 \rightarrow l_3$ is a short arc and the corresponding inequality is $x_3 - x_0 \leq 1$. Similar inequalities are constructed for the remaining five short arcs in the path graph. The path graph has only one long arc $l_3 \rightarrow l_0$. This arc contributes the following three inequalities: $l_0 - l_3 \leq 0$, $l_0 - l_3 - \epsilon_{03} \leq -1$ and $\epsilon_{03} \geq 0$.

The optimization problem can be formulated directly from the path graph:

$$\text{maximize} - \alpha \epsilon_{30} + \beta(x_0 + x_2 - 2x_3)$$
$$\text{subject to}$$
$$x_1 - x_0 \leq 1 \quad x_2 - x_0 \leq 1$$
$$x_3 - x_0 \leq 1 \quad x_3 - x_1 \leq 0$$
$$x_3 - x_2 \leq 0 \quad x_0 - x_2 \leq 1$$
$$x_0 - x_3 \leq 0 \quad x_0 - x_3 - \epsilon_{30} \leq -1 \quad \epsilon_{30} \geq 0$$

The first six inequalities correspond to the short arcs. The last three inequalities correspond to the long arc $l_3 \rightarrow l_0$. We solve the optimization problem using a conventional minimum-cost flow algorithm and obtain the solution: $x_0 = 0$, $x_1 = 1$, $x_2 = 1$ and $x_3 = 1$. We assume that $\alpha = 10$ and $\beta = 1$. The arrival times for all primary inputs are 0. The arrival times for outputs of latches $l_1$, $l_2$ and $l_3$ are $-1$, $-1$ and $-1$, respectively. The required time for all primary outputs is the desired clock period 2. Required times for the inputs of latches $l_1$, $l_2$ and $l_3$ are 1, 1 and 1, respectively. We resynthesize the combinational logic under these delay constraints.

Figure 3:
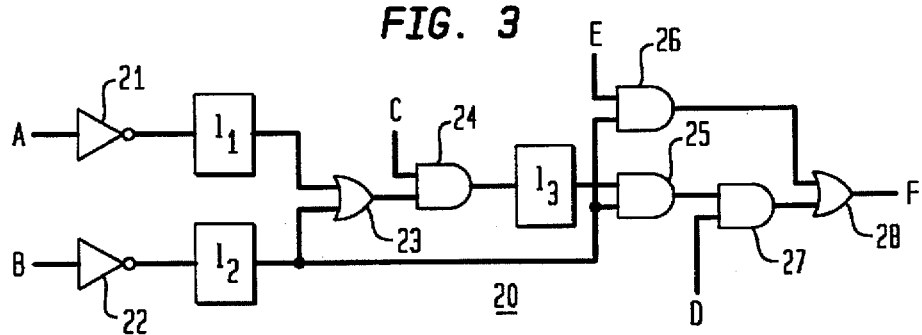
FIG. 3 is a block schematic of the circuit of FIG. 1 after it has been resynthesized to meet the set of optimal delay constraints found in accordance with the invention.

The resynthesized circuit is shown in FIG. 3. As seen, the resynthesized circuit 20 includes inverters 21 and 22 supplied by input terminals a and b, respectively.

The two outputs of the inverters form the inputs to latches $l_1$ and $l_2$ whose outputs from the inputs to the OR gate 23. Its output forms one input to AND gate 24, the other of whose inputs is supplied from terminal c. The output of AND gate 24 is supplied to latch $l_3$ whose output forms one input to AND gate 25, whose other input is supplied by the output of latch $l_2$. This output is also applied as an input to AND gate 26 whose other input is supplied by the input terminal e. The output of AND gate 25 is applied as one input to AND gate 27 whose other input is supplied by terminal d. The outputs of AND gate 27 and of AND gate 26 form the two inputs to OR gate 28, whose output is available at output terminal f. The delay optimizer has satisfied all the specified delay constraints. However, note that the resynthesized combinational logic has paths exceeding the desired clock period of 2. However, this circuit can be retimed to achieve the desired clock period.

This can be shown as follows. Let S' be the circuit obtained by resynthesizing circuit S using the optimal delay constraint. Circuit S' is always retimable to achieve a clock period of $\phi - \epsilon$. It suffices to show that the resynthesized circuit S' has no critical paths or cycle as done below. This is because we now establish that a critical path or length is a necessary condition to prevent retiming. It is already known that the existence of a critical path or cycle is a sufficient condition to prevent retiming.

We now show that a critical path or cycle is also a necessary condition to prevent retiming. We model digital circuit as a directed graph G(V, E) where V and E are the vertex and arc set, respectively. Graph G has a vertex for every primary input, primary output or combinational logic gate. There is an arc e from vertex u to vertex v (represented as $u \rightarrow^e v$) if gate u is an input to gate v. Furthermore, we associate a delay $d_v \geq 0$ with vertex v and a weight $w_e \geq 0$ with every arc e. Here, $d_v$ is the propagation delay of gate v and $w_e$ is the number of latches on the arc e.

The augmented graph H is obtained from the graph G by replacing primary input and primary output vertices in graph G by a single host node. Therefore, graph H has the same set of vertices as the graph G, except for the primary input and primary output vertices of G. Also, H has an additional host vertex. Graph H has the same arc set as graph G except for outgoing arcs of the primary input vertices and incoming arcs of the primary output vertices. All outgoing arcs from the primary input vertices in graph G now originate from the host in the augmented graph H. Similarly, all incoming arcs to the primary output vertices in G now go into the host. The delays of vertices in G and H are also the same, except that the host vertex is assigned a delay of zero. The arc weights in H are the same as the arc weights in G. If there is a zero delay path from a primary input to a primary output $v_i$ in graph G, there will be a zero weight cycle in H. However, we we increment the weight on all incoming arcs of the host by 1 and we will refer to such arcs as latch arcs. Incrementing the weight on a latch arc is equivalent to adding an extra latch between the primary output $v_i$ and the node driving this primary output in graph G. There will be as many latch arcs in H as there are primary outputs in G.

In a paper entitled "Retiming Synchronous Circuitry; published in Algorithmica, Vol 6, pp 5–35 (1991), Leiserson and Saxe have identified necessary and sufficient conditions under which any augmented graph is retimable provided that all vertices in the augmented graph have unit delay. In our case, the host node in H has zero propagation delay and, as we show later, this causes a slight technical problem for their proof to go through. Furthermore, we are interested in a specific retiming in which $H^R$ has at least one latch on every latch arc. The retiming proposed by Leiserson and Saxe does not guarantee this. It is possible to obtain a specific retiming of H in which every latch arc has at least one latch by using a minor modification of their result.

Let G be the circuit graph of a unit delay synchronous circuit S and let H be the augmented graph obtained from G. We show that G is retimable if and only if the augmented graph H can be retimed so that each latch arc has a weight of 1 in $H^R$. Given such a retiming of H, we obtain $G^R$ as follows. We delete the host node and remove a latch from every incoming arc to the host node in $H^R$.

It is convenient to introduce a new graph H' which has the same vertex set and arc set as H. Vertices in H' have the same delay as the corresponding vertices in H. However, the arc weight $w'_e$ of any arc e in H' is $$w_e' = w_e - \frac{1}{\phi - \epsilon}$$

except for outgoing arcs of the host. If e is an outgoing arc from the host, $w_e' = w_e$. We obtain a retiming of H by using the graph H'. A similar technique has been used by Leiserson and Saxe. However, there are two subtle differences. Leiserson and Saxe's technique is applicable to graphs in which every vertex has a unit delay. Since we allow vertices with 0 propagation delay, their result is not directly applicable. Furthermore, to account for zero propagation delay vertices, we construct the graph H' in a slightly different way. Outgoing arcs of the host in H and H' have identical weights.

In Leiserson and Saxe's construction, weights of outgoing arcs of the host are also decreased by $$\frac{1}{\phi - \epsilon}.$$

Let this graph be L'. If G has path from a primary input to a primary output with delay $\phi - \epsilon$, the corresponding cycle in L' will have a negative weight of $$-1 + 1 - \frac{1}{\phi - \epsilon} = -\frac{1}{\phi - \epsilon}$$

and we wrongly conclude that G is not retimable.

Lemma 1:

The graph H is retimable with every latch arc in $H^R$ having a positive weight if and only if H' does not have a negative weight cycle.

Proof:

Assume that H' has no negative weight cycle. We shall produce a retiming r of H so that the clock period is less than or equal to $\phi - \epsilon$. Let g(v) be the weight of the shortest path from v to $v_h$, the host vertex in H'. We define the retiming function r as follows:

$$r(v) = \lceil \frac{1}{\phi - \epsilon} + g(v) \rceil - 1.$$

We claim that this a legal retiming of H. Furthermore, we show that every latch arc has a positive weight.

Non-negativity constraints:

We show that every arc in the retimed graph has non-negative edge weight. The shortest path from u to $v_h$ is at least as short as the path $u \rightarrow^e v \Rightarrow^p v_h$. Here, p is the shortest path from v to $v_h$. If u is the host, then $g(u) \leq g(v) + w(e)$. Therefore, $$g(u) + \frac{1}{\phi - \epsilon} \leq g(v) + \frac{1}{\phi - \epsilon} + w(e).$$

Taking ceilings on both sides, $$\lceil g(u) + \frac{1}{\phi - \epsilon} \rceil - 1 \leq \lceil g(v) + \frac{1}{\phi - \epsilon} \rceil - 1 + w(e).$$

This yields $r(u) \leq r(v) + w(e)$. Similarly, if u is any vertex other than the host, then $g(u) \leq g(v) + w(e) - 1/c$. By adding $$\frac{1}{\phi - \epsilon}$$

to both sides and taking the ceilings of both sides, we get $r(u) \leq r(v) + w(e)$. Therefore, the proposed retiming satisfies the non-negativity constraints.

Timing constraints:

We show that there is at least one latch on any path with delay grearer than $\phi - \epsilon$. We consider two cases. Consider a path $u \Rightarrow^p v$ that includes the host vertex and it has $\phi - \epsilon + 1$ or more arcs. Therefore, the delay of this path is at least $\phi + 1$. The weight on this path in H' can be most w(p)-1 since there are at least c edges with weight $$\geq \frac{-1}{c}.$$

Using shortest path arguments, $g(u) \leq g(v) + w(p) - 1$. By adding $$\frac{1}{\phi - \epsilon}$$

to both sides and taking the ceilings of both sides, we get $r(u) \leq r(v) + w(e) - 1$. Similarly, consider a path p that does not include the host and it has $\phi - \epsilon$ or more arcs. Again, the weight on this path in H' can be at most w(p)-1 and $g(u) \leq g(v) + w(p) - 1$. Again, by adding $$\frac{1}{\phi - \epsilon}$$

to both sides and taking the ceilings of both sides, we get $r(u) \leq r(v) + w(e) - 1$. Therefore, the proposed retiming satisfies the timing constraints.

Latch arcs have positive weight:

Consider the latch arc $u \rightarrow^e v_h$. Clearly, $$r(v_h) = \lceil \frac{1}{\phi - \epsilon} + g(v_h) \rceil - 1 = 0$$

since $g(v_h) = 0$ due to the absence of negative cycles. Also, since there are no negative cycles in H and u has only path to the host vertex, $$g(u) = g(v_h) + w(e) - \frac{1}{\phi - \epsilon} = w(e) - \frac{1}{\phi - \epsilon}$$

Therefore, r(u)=w(e)-1. Therefore, $r(v_h)-r(u)+w(e)-1$ and there a latch on the latch arc in $H^R$.

If H' contains a negative weight cycle, a retiming of H is impossible. Consider a cycle p in H' that includes the host and has n arcs. Therefore, the delay of this cycle is n-1. Since the cycle has a negative weight, $$w(p) - \frac{n-1}{\phi - \epsilon} < 0.$$

Here, w(p) is the weight of the corresponding cycle in H. Since the number of latches is less than $$\frac{n-1}{\phi - \epsilon},$$

therefore, this is a critical cycle. Similarly, consider a cycle p that does not include the host and has n arcs. The delay of this cycle is n. Therefore, $$w(p) - \frac{n}{\phi - \epsilon} < 0$$

and the cycle is critical. Hence, if H' has a negative cycle, retiming is impossible.

We now state the main result.

Theorem 1:

Le S be a unit delay synchronous circuit that has a clock period $\phi$. Circuit S can be retimed to achieve a clock period $\phi - \epsilon (\epsilon > 0)$ if and only if S has no critical paths or critical cycles.

Proof:

If S has a critical path or cycle, S cannot be retimed. We have to show that if S is not retimable, then S must have a critical path or cycle.

Let H be the augmented graph corresponding to the circuit S. ¿From Lemma??, H is not retimable if and only if H' has a negative weight cycle. Furthermore, a negative weight cycle in H' corresponds to a critical cycle in H. Critical cycles in H that include the host correspond to critical paths in S. Similarly, critical cycles in H that do not include the host correspond to critical cycles in S.

;From Lemma??, there exists a retiming of H so that every latch arc has a weight of at least one. Therefore, circuit $S^R$ can be obtained by $H^R$ as described earlier.

Having established that critical paths or cycles are necessary to prevent retiming, we now show that resynthesized circuits using optimal delay constraints have no critical paths or cycles.

Theorem 2:

Let S' be the circuit obtained by resynthesizing circuit S using the optimal delay constraint. Circuit S' is always retimable to achieve a clock period of $\phi-\epsilon$.

Proof:

As explained before, it suffices to show that the resynthesized circuit S' has no critical paths or cycle.

Absence of critical paths:

Consider a path with primary input $l_0$ and primary output $l_{n+1}$ with n latches labeled $l_2 \ldots l_{n-1}$. We show that the delay of this path is less than or equal to $(n+1)\times(\phi-\epsilon)$. Let $p_{ij}$ be the delay between $l_i$ and $l_j$. Therefore, the delay of this path is bounded by $\Sigma^{i=n}_{i=0} p_{i,i+1}$. Since resynthesis of S guarantees that $p_{i,i+1} \leq (\phi-\epsilon)-(x_{i+1}-x_i)$ and $x_0=x_{n+1}=0$, the summation is bounded by $(n+1)\times(\phi-\epsilon)$.

Absence of critical cycles:

Consider a cycle in S' with latches $l_1 \ldots l_n$. We show that the delay of this cycle is less than or equal to $n\times(\phi-\epsilon)$. Again, let $p_{ij}$ be the delay between $l_i$ and $l_j$. Therefore, the delay of this path is bounded by $\Sigma^{i=n}_{i=0} p_{i,i+1}$. Here, $P_{n,n+1}$ is the delay between latches $l_n$ and $l_1$. Using $p_{i,i+1} \leq (\phi-\epsilon)-(x_{i+1}-x_i)$, the summation is bounded by $n\times(\phi-\epsilon)$.

Retiming Resynthesized Circuits:

The resynthesized circuit can be retimed using various existing methods. However, a novel simpler method for retiming the circuit is a separate feature of this invention. Moreover, this new approach can be used to retime any unit delay sequential circuit. The resynthesized circuit has no critical paths or cycles. Therefore, the delay on all combinational paths between primary inputs and primary outputs of $S^R$ is less than the desired clock period of $\phi-\epsilon$.

Retiming moves latches. It is possible to compute the latch movements required to retime the circuit by again viewing the circuit as an interconnection of path segments and by computing the arrival times of the latch output signals. We use the short and long path segment constraints previously described but we construct a different objective function. Our goal now is only to increase the tolerable delay on long path segments so that the tolerable delay is equal to the delay in the resynthesized implementation. The optimization problem can be stated as follows:

Maximize (2)

$$-\sum_{l_i \to l_j \in P_2} \epsilon_{ij}$$

subject to $l_i \to l_j \in P_1$:

$$x_j - x_i \leq \phi - \epsilon - d_{ij}$$

$l_i \to l_j \in P_2$:

$$x_j - x_i \leq 0$$
$$x_j - xi - \epsilon_{ij} \leq \phi - \epsilon - d_{ij}$$
$$\epsilon_{ij} \geq 0$$

Since the circuit has no critical paths or cycles, the optimum value of the objective function is 0. A minimum cost network flow algorithm can be used to compute the optimal arrival times. If $X_i$, $0 \leq i \leq k$ is the optimal arrival time of the output signal of latch $l_i$, then the latch is $X_i$ units of time forward. If $X_i$ is negative, then the latch is moved $X_i$ units of time backward.

A systematic procedure to retime the circuit is as follows:
1. Construct the path graph for resynthesized circuit.
2. Classify arcs into short and long arcs with $\phi-\epsilon$ as the desired clock period.
3. Formulate inequalities for short and long arcs. Again, there is one inequality for each short arc and three inequalities for every long arc.
4. Construct the objective function. It is the summation of all the $\epsilon_{ij}$,s for long paths $l_i \to l_j$ in the path graph.
5. Solve optimization problem using known minimum-cost flow algorithm as before. Let the solution be $X_0, X_1, \ldots, X_k$.
6. If $X_i$, $0 \leq i \leq k$, is the optimal arrival time of the output signal of latch $l_i$, then the latch is moved $X_i$ units of time forward. If $X_i$ is negative, then the latch is moved $X_i$ units of time backward.

Figure 4:
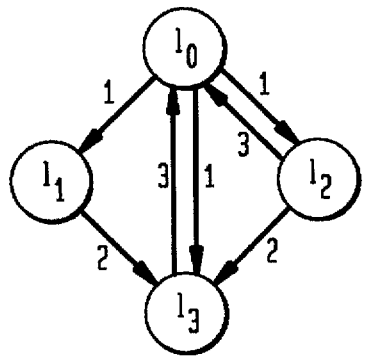
FIG. 4 is the path segment graph of the resynthesized circuit of FIG. 3.

As an example, consider the previously described resynthesized circuit shown in FIG. 3. Its path graph is shown in FIG. 4. The path graph has two long path segments. There is a long path from $l_3$ to $l_0$ and the other long path is between $l_2$ and $l_0$. We formulate the following optimization problem:

maximize $-\epsilon_{30} - \epsilon_{20}$
subject to $x_1 - x_0 \leq 1$  $x_2 - x_0 \leq 1$ $x_3 - x_0 \leq 1$  $x_3 - x_1 \leq 0$ $x_3 - x_2 \leq 0$  $x_0 - x_2 \leq 1$
$x_0 - x_3 \leq 0$  $x_0 - x_3 - \epsilon_{30} \leq -1$  $\epsilon_{30} \geq 0$ $x_0 - x_2 \leq 0$  $x_0 - x_2 - \epsilon_{20} \leq -1$  $\epsilon_{20} \geq 0$ The optimal solution is $x_0=0$, $x_1=x_2=x_3=1$. Latches $l_1$, $l_2$ and $l_3$ can moved forward by one unit of time to obtain the retimed circuit 30 shown in FIG. 5.

Figure 5:
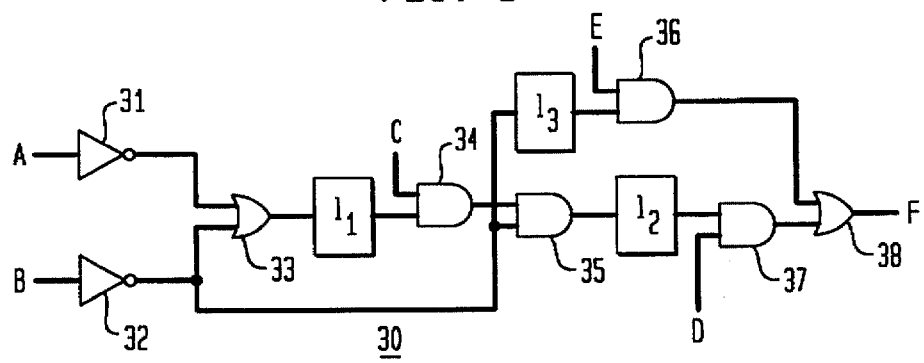
FIG. 5 is a block diagram the circuit obtained by retiming the resynthesized circuit of FIG. 3, to operate at a clock period of two delay units.

As can be seen by comparing circuit 20 of FIG. 3 and circuit 30 of FIG. 5, where corresponding gates differ by 10, in circuit 30, latch $l_1$, has been repositioned between the output of OR circuit 33 and an input of AND circuit 34; latch $l_2$ has been repositioned between the ouput of AND circuit 35 and an input of AND circuit 37; and latch $l_3$ has been repositioned between the ouput of inverter 32 and an input to AND gate 36.

Figure 6:
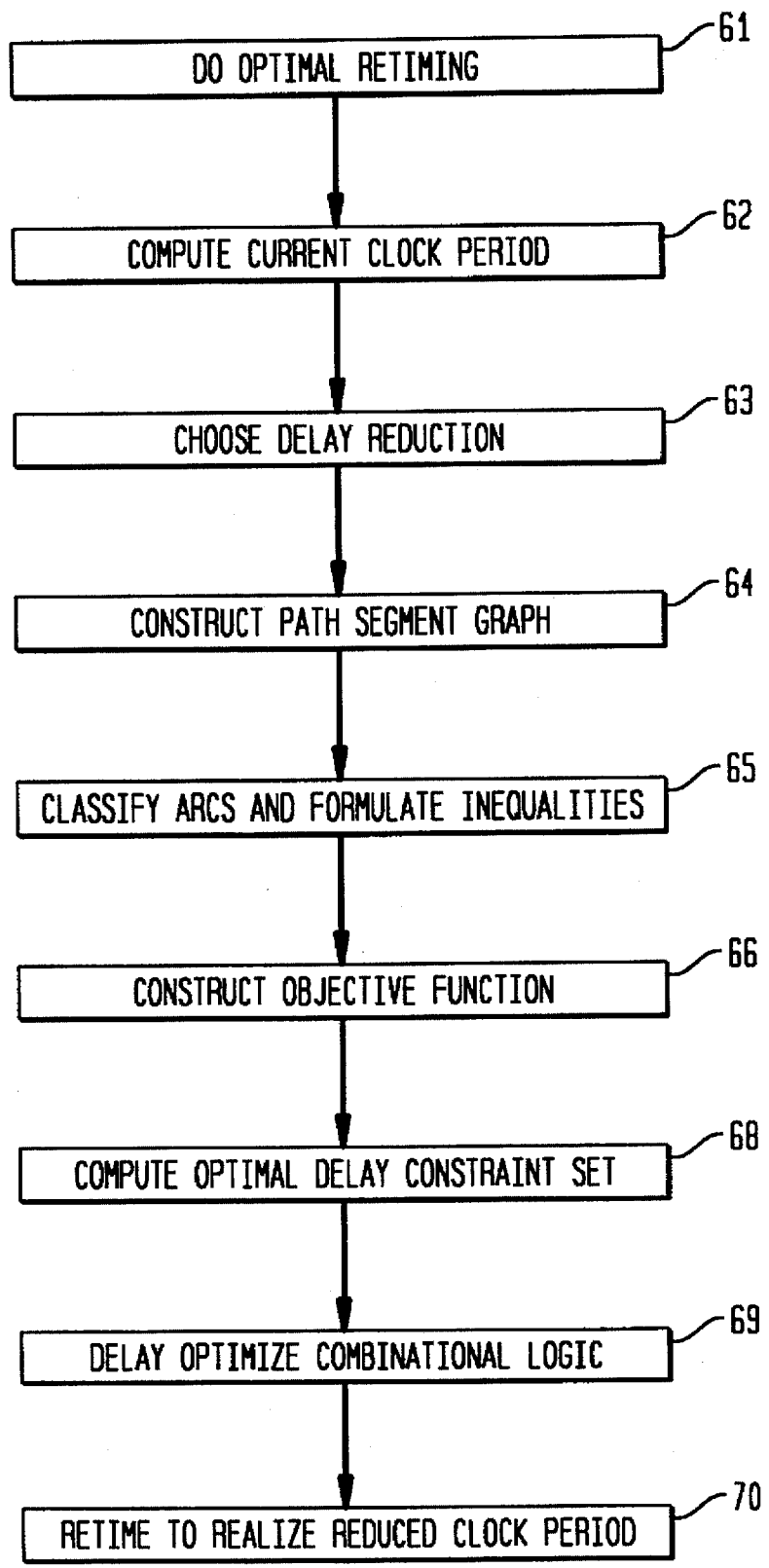
FIG. 6 is a flow diagram of the basic steps of the redesign process of the invention.

By way of summary, FIG. 6 is a flow chart 60 of the basic steps of the redesign process that has been described.

One begins by doing the standard techniques to reduce the delay of the longer combinational segments of the circuit that are the paths that are responsible for the undersirably long delay. As an important technique of this kind is retiming, as indicated by block 61.

After such retiming, there is computed the clock period required for the circuit then available as indicated by block 62, and a certain delay, such as a unit delay, is then chosen as the reduction to be sought for initially, indicated by block 63.

Then there is constructed a path segment graph of the kind shown in FIG. 2, represented by block 64, and the various arcs of the graph are classified either as long, if there length was greater than the reduced delay being sought or short if their length was no greater than the reduced delay being sought, as indicated by block 64. After the arcs are so classified, the path inequalities, three for each long arc, one for each short arc, are formulated, represented by block 65.

From these sets of path inequalities, the objective function is constructed (block 66) and by means of a standard minimum cost flow algorithm, there is computed the optimal delay constraint set that needs to be satisfied, indicated by block 68.

Then as represented by block 68, there is synthesized a new circuit whose combinational logic segments satisfy the optimal delay constraint set, shown in FIG. 3.

Then as represented by block 70, this circuit is then retimed to provide the circuit shown in FIG. 5, that can operate with a reduced clock period.

In those instances where one will seek to reduce the clock period still further, one can return to step 63 and choose to try for a further reduction.

What is claimed is:

1. A method for redesigning a sequential circuit having one or more combinational circuits, wherein said combinational circuits include one or more logic gates and are separated by flip-flops, said redesign process utilizing a combination of resynthesis and retiming such that a clock period at which the circuit operates is minimized, said redesign method comprising the steps of:

constructing, during a logic-synthesis phase of circuit design, a path segment graph of the sequential circuit that includes arcs and nodes such that one of the nodes represents all the primary inputs and primary outputs and the others represent latches in the sequential circuit and the arcs represent combinational path segments separated by the flip-flops;

classifying arcs representative of the combinational path segments in the circuit whose delays are to be reduced as long arcs and arcs representative of combinational path segments in the circuit whose delays are not to be reduced as short arcs;

forming sets of path inequalities appropriate to long and short arcs and from said sets forming an objective function;

deriving an optimal set of delay constraints from said objective function;

resynthesizing the circuit to meet the optimal set of delay constraints by changing a type or quantity or interconnection of logic gates; and retiming the resynthesized circuit to reduce the delay of the selected combinational path segments of the sequential circuit by repositioning one or more of the flip-flops contained within the circuit, such that the clock period needed for operating the sequential circuit is reduced.

2. The method according to claim 1 wherein said classifying step classifies the arcs representative of the combinational path segment as a long are if a weight of a particular arc is greater than a desired click period and classifies the arcs representative of the combinational path segment as a short arc if a weight of a particular arc is less than the desired clock period.

3. The method according to claim 1 whereto said classifying step classifies said arcs into short and long arcs with $\phi-\epsilon$ a as a desired clock period.

4. The method according to claim 3 wherein said forming step constructs the objective function by summing all $\epsilon_{ij}$ for long paths $l_i \rightarrow l_j$ in the path segment graph.

5. The method according to claim 4 wherein said optimal set of delay constraints is determined using a minimum-cost flow mithod and a solution is $X_0, X_1, \ldots, X_k$.

6. The method according to claim 5 wherein said retiming step repositions the flip-flop $X_i$ units of time forward when $X_i$ is a optimal arrival time of an output signal of a flip-flop $l_i$, and $0 \leq i \leq k$, and repositions the flip-flop $X_i$ units of time backward when $X_i$ is negative.

* * * * *